United States Patent [19]
Flödl

[11] Patent Number: 4,877,460
[45] Date of Patent: Oct. 31, 1989

[54] SOLAR CELL MODULE

[75] Inventor: Helmut Flödl, Bad Friedrichshall, Fed. Rep. of Germany

[73] Assignee: Telefunken electronic GmbH, Heilbronn, Fed. Rep. of Germany

[21] Appl. No.: 164,464

[22] Filed: Mar. 4, 1988

[30] Foreign Application Priority Data

Mar. 17, 1987 [DE] Fed. Rep. of Germany ....... 3708548

[51] Int. Cl.$^4$ ............................................. H02N 6/00
[52] U.S. Cl. ..................................... 136/244; 136/251
[58] Field of Search ................................ 136/244, 251

[56] References Cited

U.S. PATENT DOCUMENTS

| | | | |
|---|---|---|---|
| 3,369,939 | 2/1968 | Myer | 136/246 |
| 3,433,676 | 3/1969 | Stein | 136/253 |
| 3,562,020 | 2/1971 | Blevins | 136/244 |
| 3,769,091 | 10/1973 | Leinkram et al. | 136/246 |
| 4,089,705 | 5/1978 | Rubin | 136/244 |
| 4,617,420 | 10/1986 | Dilts et al. | 136/244 |
| 4,617,421 | 10/1986 | Nath et al. | 136/244 |

FOREIGN PATENT DOCUMENTS

| | | | |
|---|---|---|---|
| 1213749 | 3/1966 | Fed. Rep. of Germany | 136/245 |
| 1900069 | 9/1970 | Fed. Rep. of Germany | 136/244 |
| 1927387 | 12/1977 | Fed. Rep. of Germany | 136/244 |
| 3337658 | 4/1985 | Fed. Rep. of Germany | 136/251 |
| 2040562 | 8/1980 | United Kingdom | 136/244 |

OTHER PUBLICATIONS

R. A. Pryor et al., "A Novel Solar Cell Interconnection Design", Twelfth IEEE Photovoltaic Specialists Conference, Nov. 1976, pp. 375-378.

Primary Examiner—Aaron Weisstuch
Attorney, Agent, or Firm—Spencer & Frank

[57] ABSTRACT

The invention relates to a solar cell module wherein solar cell rows comprising several cells ae arranged overlapping such that in accordance with the invention the butt joints of adjacent solar cell rows are offset in relation to one another, thereby permitting parallel and serial connection within the solar cell module in accordance with the invention.

7 Claims, 1 Drawing Sheet

SOLAR CELL MODULE

BACKGROUND OF THE INVENTION

The invention relates to a solar cell module of solar cells arranged in overlapping fashion and electrically interconnecting in the overlap zone. The solar cells constructed as a solar cell module are connected in series for generation of the required voltage. An array of this type is already known from Federal Republic of Germany DE-AS No. 12 13 749. To generate higher current intensities several modules must be connected in parallel, so that inactive areas occur between adjacent modules and substantially decrease the overall efficiency of the array. Furthermore, connection of several solar cell modules into a solar cell generator has so far been accomplished by a relatively expensive manufacturing process.

SUMMARY OF THE INVENTION

The object of the invention is to provide a solar cell module whose solar cells can be connected both in parallel and in series such that said solar cells are arranged and connected in an extremely space-saving manner.

According to the invention there is provided a solar cell module of the type mentioned at the outset where rows of solar cells comprising at least two solar cells are arranged with an overlap such that the butt joints created by lining up said solar cells into a solar cell row are offset in relation to those in adjacent solar cell rows.

The possibility provided by the solar cell array in accordance with the invention of connecting the solar cells not only in series but also in parallel within the solar cell module means that all required current/voltage ratios are feasible without additional circuitry and without having to provide additional area. This allows a maximum density of solar cells to be packed in, partly because no inactive areas are required for connection of the cells, so increasing the efficiency of the solar cell module in accordance with the invention to more than 11% as compared to 9.5% which is typical for conventional solar cell modules connected up into solar cell generators. A further advantage is that very large cell surfaces having an area of more than 100 cm² can be produced, where the rigid link in accordance with the invention prevents any shift of the solar cells in relation to one another during the module embedding process, so that the possibility, present in conventional cells, of breaks in the connecting lines between adjacent solar cell modules is also avoided. In addition, simple manufacture of solar cell modules in accordance with the invention permits a substantial decrease in production costs.

Further advantageous embodiments of the invention are given in the description which follows.

BRIEF DESCRIPTION OF THE DRAWINGS

The invention and its embodiment will be described below on the basis of an embodiment example.

DESCRIPTION OF THE PREFERRED EMBODIMENTS

In the embodiment shown, five solar cell rows 2 are arranged in overlapping fashion, with the solar cell rows 2 being alternately of three or four lined-up solar cells 1, for example of polycrystalline silicon, having their rear sides completely metallized, with two types of solar cell being used that differ only in their length. For this purpose, a solar cell having for example the dimensions 10 cm × 10 cm is divided in the middle to provide two solar cells of elongated rectangular shape, with these cells being the first type. The second type of solar cell is produced by centrally dividing the first type on its long side. The solar cells 1 of the first and second type have the same width but differ in length, with the solar cells of the first type being twice as long as the second type.

Figure 1:
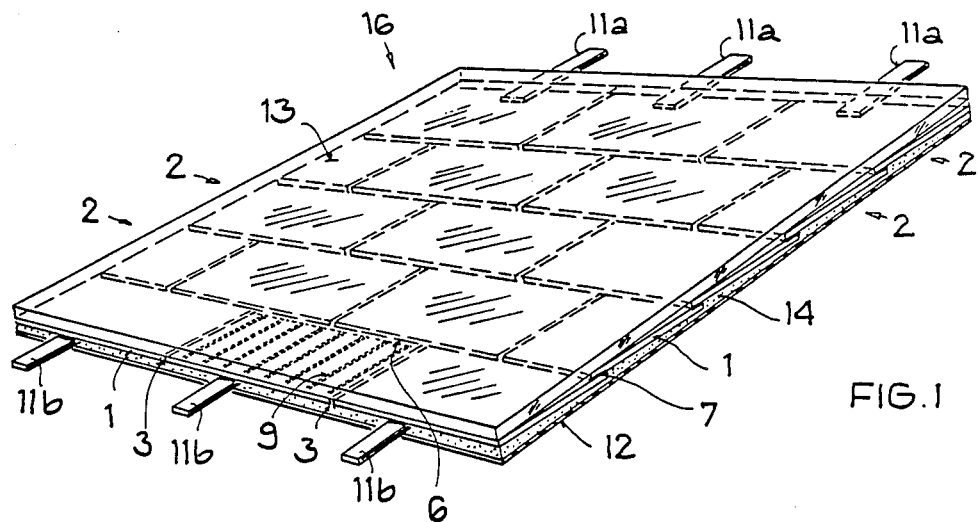
FIG. 1 shows a perspective view of an embodiment of the solar cell module in accordance with the invention.

The solar cell row according to FIG. 1 located on the bottom left-hand edge of the solar cell module and designated as the first solar cell row, comprises three lined-up solar cells 1 of the first type having identical length, giving two butt joints 3. The output contacts 11b are arranged on the outer edge of the rear of this first solar cell row 2 and the contact bridge 6 is located diametrically opposite on the outer edge of the front of the first solar cell row, the contact bridge being connected to the contact fingers 9 perpendicular thereto on the solar cells. The adjacent solar cell row, designated as the second solar cell row, comprises two solar cells each of the first and second types, arranged such that the longer solar cells are lined up directly between the two shorter ones, resulting in three butt joints 8. To solder the two solar cell lines in a manner according to the invention, solder paste 7, for example a SnPb(36%)Ag(2%) paste is applied, after manufacture of the contact fingers 9 and contact bridges 6 of the solar cell by screen printing, to the contact bridges 6 by the same process, so defining the overlap zone 8 of approx. 1 mm width.

The connection of the two solar cell rows 2 is achieved by connecting the second solar cell row 2 to the first solar cell row 2 in shingle style in the overlap zone 8 by means of a soldering process, e.g. heating in an infra-red continuous-heating furnace, in such a way that the three butt joints of the second solar cell row are each in the center of the longitudinal sides of the three solar cells in the first solar cell row, and conversely the two butt joints 3 of the first line are each in the center of the two center solar cells of the second cell row.

Thanks to the continuous contact bridges 6 of the first solar cell row, the rear sides of the solar cells of the second cell row are connected to the same potential, and conversely the metal coating 15 on the rear of the solar cells in the second cell row causes the front sides of the solar cells of the first cell row to also be connected to the same potential.

As can be seen from FIG. 1, the third solar cell row adjacent to the second cell row and comprising three solar cells of the first type is soldered in the same way as described above to the second solar cell row, with the butt joints also being in the center of the longitudinal sides of the center solar cells of the second solar cell row and the front sides of the solar cells of the second cell row being connected to the same potential.

Continuing in this way, i.e. alternating solar cell rows having three and four solar cells, a solar cell module in accordance with the invention and corresponding to FIG. 1 is constructed. The butt joints created of adjacent solar cell rows 2 are offset in relation to one another, so achieving parallel connection of the solar cells 1 of a solar cell row 2. Furthermore, the shingle-style construction is clearly shown in FIG. 2, achieving at the same time series connection of the solar cell lines. The output contacts 11a, 11b are attached to the contact bridge 10 located on the edge of the front side of the last solar cell row, and to the outer edge of the metalcoated rear side 15 of the first solar cell row. The solar cell panel 16 built up of parallel- and series-connected solar cells 1 is embedded in plastic 14, for example EVA, and closed on its rear side 5 for example with an aluminum foil 12. The glass plate 13 arranged on the front side 4 is used as the carrier plate.

Figure 2:
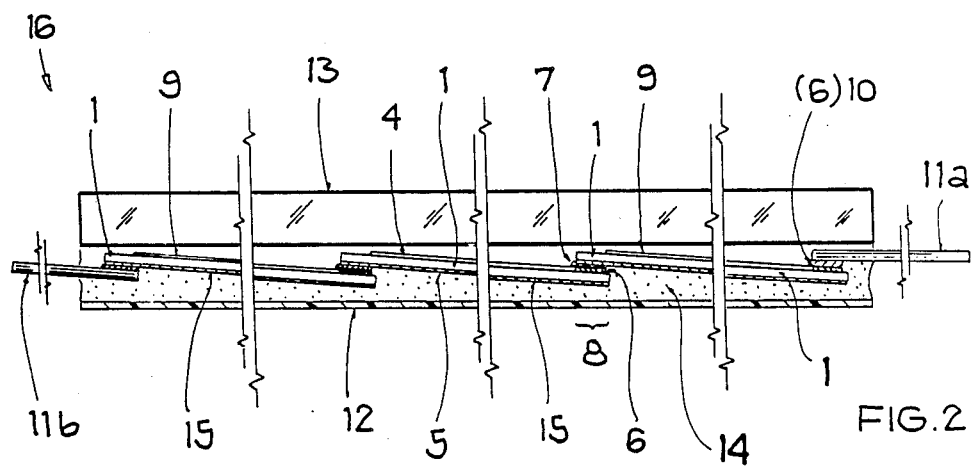
FIG. 2 is a sectional view of the embodiment of the solar cell module in accordance with FIG. 1.

The embodiment of the invention described in FIGS. 1 and 2 can be adjusted to required current/voltage ratios by altering both the number of solar cells connected in parallel in the solar cell rows and the number of solar cell rows connected in series to suit these current/voltage ratios.

What is claimed is:

1. In a solar cell module comprising a plurality of rows of solar cells with adjacent ones of said solar cell rows being arranged with an overlap, and being electrically interconnected in the overlap zone, and with each solar cell row including at least two solar cells and having the butt joints created by the alignment of the solar cells in a solar cell row offset relative to those in adjacent said solar cell rows; the improvement wherein: each of said solar cells has a rectangular configuration and is provided on its front surface with a conductive contact bridge which extends parallel to and along one entire edge; the overlap zones on said front surfaces in the region of said contact bridges and the overlap zones on the diametrally opposed edges of the rear surfaces, extend over the entire length of a respective solar cell row and make direct contact with the aligned said solar cells in a respective solar cell row as well as with the successive said solar cell rows so that the aligned solar cells of a solar cell row are connected in parallel and the aligned solar cell rows are connected in series; and said solar cell rows are soldered together at the contacts in the overlap zones.

2. A solar cell module according to claim 1, wherein the series/parallel connection of solar cells is connected at both ends to current output contacts.

3. A solar cell module as defined in claim 1 wherein said module is rectangular and includes two different sizes of said rectangular solar cells.

4. A solar cell module comprising a plurality of rectangular solar cells each having a conductive contact bridge on its front surface extending along and parallel to one entire edge of the respective said solar cell, and a rear surface contact; and wherein: said solar cells are arranged in a plurality of solar cell rows, each including at least two of said solar cells, with the respective said contact bridges being aligned and with each two adjacent solar cells of a row forming a butt joint therebetween; said solar cell rows being arranged parallel to one another such that the butt joints of one row are offset from those of the adjacent said rows; and said aligned contact bridges of said rows are overlapped by the edges of said solar cells of a respective adjacent row which are opposite said one edge and are contacted by and soldered to said rear surfaces of said solar cells of said adjacent row, whereby said solar cells of a solar cell row are connected in parallel and said solar cell rows are connected in series.

5. A solar cell module as defined in claim 4 wherein said module has a rectangular shape and includes two different sizes of said rectangular solar cells.

6. A solar cell module as defined in claim 5 wherein at least some of said solar cell rows include solar cells of both of said two different sizes.

7. A solar cell module as defined in claim 4 further comprising respective conductors connected to said contact bridges of the solar cells of the one of said solar cell rows located at the end of said module and to said rear contacts of the one of said solar cell rows located at the opposite end of said module.

* * * * *